US 6,633,156 B1

(12) United States Patent
Choisnet

(10) Patent No.: US 6,633,156 B1
(45) Date of Patent: Oct. 14, 2003

(54) DEVICE FOR MONITORING THE FLOW OF A SUBSTANTIALLY DIRECT CURRENT IN A LOAD AND METHOD FOR THE IMPLEMENTATION OF THIS DEVICE

(75) Inventor: Joël Choisnet, Naveil (FR)

(73) Assignee: Thales Avionics S.A., Velizy Villacoublay (FR)

( * ) Notice: Subject to any disclaimer, the term of this patent is extended or adjusted under 35 U.S.C. 154(b) by 0 days.

(21) Appl. No.: 09/926,181

(22) PCT Filed: Mar. 17, 2000

(86) PCT No.: PCT/FR00/00664

§ 371 (c)(1),
(2), (4) Date: Sep. 19, 2001

(87) PCT Pub. No.: WO00/57197

PCT Pub. Date: Sep. 28, 2000

(30) Foreign Application Priority Data

Mar. 19, 1999 (FR) .............................................. 99 03464

(51) Int. Cl.[7] ........................ G01R 19/00; G01R 27/26; G01R 27/02; H02M 3/335; H02M 7/125
(52) U.S. Cl. ..................... 324/76.11; 324/678; 324/607; 324/679; 363/19; 363/53
(58) Field of Search ............................. 324/76.11, 678, 324/607, 679; 363/19, 53

(56) References Cited

U.S. PATENT DOCUMENTS

| | | | | |
|---|---|---|---|---|
| 3,869,658 A | * | 3/1975 | Hanke et al. ................... 363/15 |
| 4,054,833 A | * | 10/1977 | Briefer ........................ 324/678 |
| 4,562,506 A | * | 12/1985 | Moran ........................... 361/71 |
| 4,581,540 A | * | 4/1986 | Guajardo ...................... 307/117 |
| 4,737,901 A | * | 4/1988 | Woodward ..................... 363/43 |
| 4,763,014 A | * | 8/1988 | Model et al. ................... 307/66 |
| 4,797,603 A | | 1/1989 | Choisnet ...................... 324/678 |
| 4,972,725 A | | 11/1990 | Choisnet ................... 73/862.33 |
| 5,010,775 A | | 4/1991 | Choisnet ................... 73/862.33 |
| 5,164,872 A | * | 11/1992 | Howell ........................... 361/3 |
| 5,179,490 A | * | 1/1993 | Lawrence ..................... 361/42 |
| 5,182,518 A | * | 1/1993 | Stich et al. .................. 324/511 |
| 5,406,839 A | | 4/1995 | Leblond et al. ................ 73/180 |
| 5,420,777 A | * | 5/1995 | Muto ....................... 363/21.17 |
| 5,570,277 A | * | 10/1996 | Ito et al. ........................ 363/19 |
| 6,091,335 A | | 7/2000 | Breda et al. ................. 340/580 |
| 6,430,071 B1 | * | 8/2002 | Haneda ....................... 363/127 |
| 6,490,510 B1 | | 12/2002 | Choisnet ...................... 701/14 |

FOREIGN PATENT DOCUMENTS

| | | | | |
|---|---|---|---|---|
| JP | 07-110347 | * | 4/1995 | ........... G01R/19/00 |
| JP | 07-306232 | * | 11/1995 | ........... G01R/19/32 |

OTHER PUBLICATIONS

U.S. patent application Ser. No. 10/148,200 filed Jun. 7, 2002, pending.

* cited by examiner

Primary Examiner—Andrew H. Hirshfeld
Assistant Examiner—Wasseem H. Hamdan
(74) Attorney, Agent, or Firm—Oblon, Spivak, McClelland, Maier & Neustadt, P.C.

(57) ABSTRACT

A device for monitoring the flow of a current in a load powered by a DC voltage source and a method for the implementation of the device. The device includes, series-connected with the load, a first device to detect the presence of an alternating current and a second device to interrupt the current flowing in the first device while keeping the current substantially direct in the load. Advantageously, the second device includes at least one first electronic switch series-connected with the load and with the first device, the first electronic switch being controlled so as to set up the alternating current in the first device. A method of implementing the device cyclically opens and closes the electronic switch while making the second device operable or inoperable, also cyclically, to keep the current substantially direct in the load and let the current flowing in the load pass through the second device only periodically.

17 Claims, 4 Drawing Sheets

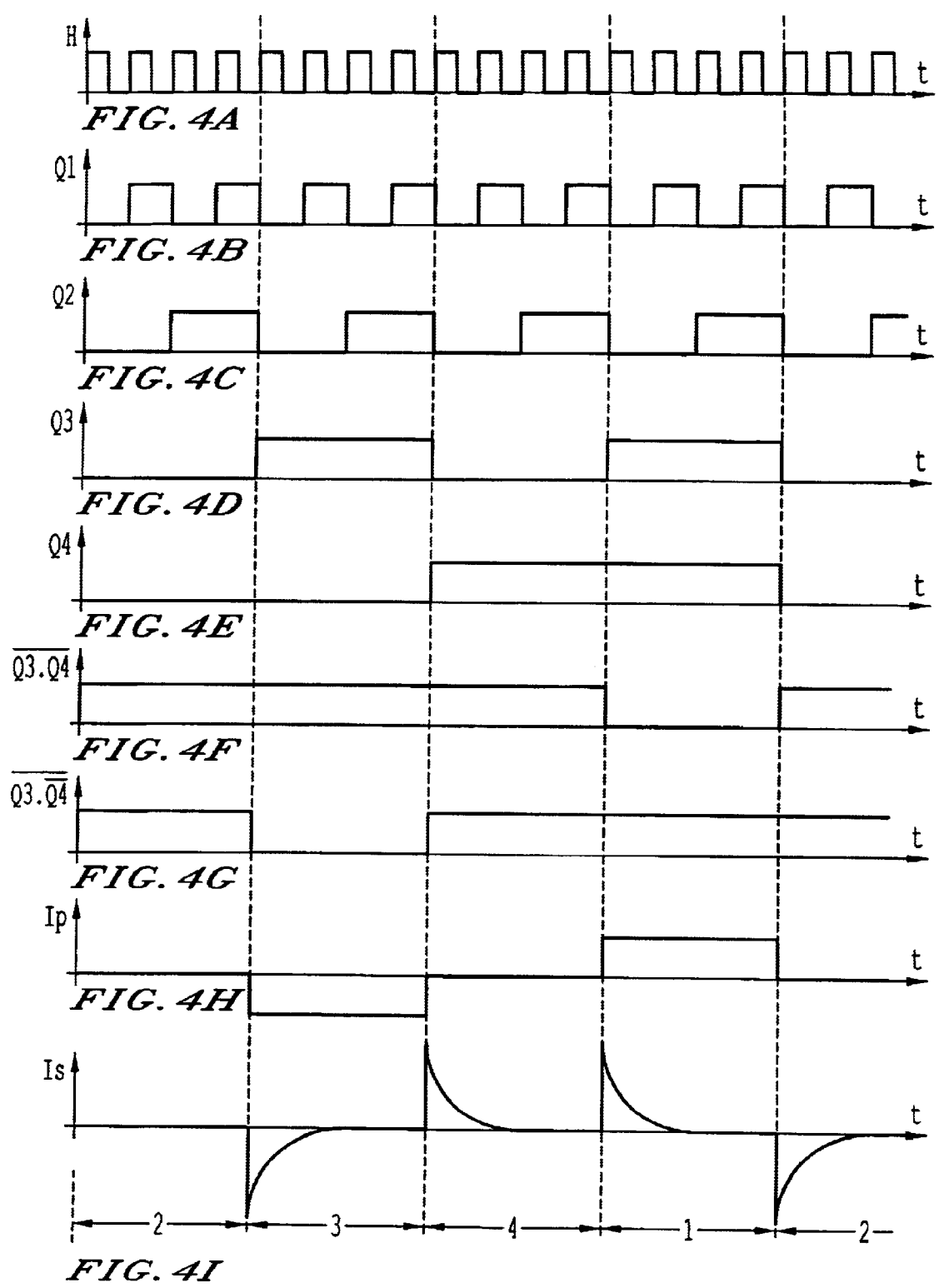

DEVICE FOR MONITORING THE FLOW OF A SUBSTANTIALLY DIRECT CURRENT IN A LOAD AND METHOD FOR THE IMPLEMENTATION OF THIS DEVICE

The invention relates to a device for monitoring the flow of a substantially direct current in a load and a method for the implementation of this device.

In certain applications, for example in aeronautics, the flow of current in a load is monitored, in order to activate an alarm if there is no current.

When the load is powered by a DC voltage source, a means can be placed on one of the power supply wires of the load to detect the flow of a current in the power supply wire of the load. If this means indicates the absence of current, it can be deduced that the power supply is absent and that the load has an operational defect. In practice, the known means used to detect the flow of a direct current, such as a Hall effect detector, require an amplifier to process the signal coming from the detector. Such an amplifier too could have an anomaly and could, for example, get blocked in a state in which it would permanently indicate the flow of a current in the load regardless of the actual existence of current flowing in the load. The monitoring device can be monitored by providing for a second monitoring device to monitor the first one This complicates the general making of the system which comprises the direct current supply, the load and the two monitoring devices.

The invention is aimed at overcoming this problem by proposing a monitoring device which, even if there is a malfunctioning of the device, will indicate an anomaly and, unlike the case of the solution considered here above, will not be able to indicate efficient operation when no current is flowing in the load.

To attain this goal, an object of the invention is a device for monitoring the flow of a substantially direct current in a load, characterized in that it comprises, connected in series with the load, first means to detect the presence of an alternating current and in that it furthermore comprises second means to interrupt the current flowing in the first means while maintaining the current in a substantially direct state in the load.

An object of the invention is also a method for monitoring the flow of a substantially direct current in a load characterized in that the method uses a device comprising, series-connected with the load, first means to detect the presence of an alternating current, second means to interrupt the current flowing in the first means as well as third means capable of short-circuiting the first and second means and in that the method gives rise gives rise, cyclically, to the sequencing of the following stages of operation so long as the load is powered:

during the first stage, the current flows only in the second means;

during the second stage, this current flows both in the second means and in the third means;

during the third stage, the current flows only in the third means;

the fourth stage is identical to the second stage.

The existence of the second and fourth stages prevents the current from being interrupted in the load. Indeed, the opening and closing of electronic switches to block the current or make it flow in the second and third means are never perfect. In the absence of the third and fourth stages, this risks causing electromagnetic disturbances due to fluctuations in the flow of the current.

Advantageously, an object of the invention is a device for the monitoring of the flow of a substantially direct current in a load, characterized in that it comprises at least one first electronic switch series-connected with the load and first means to detect the presence of an alternating current, the first electronic switch being controlled so as to set up the alternating current in the first means and in that it furthermore comprises second means to keep the current in a substantially direct state in the load.

One method of implementing this device consists in opening and closing the electronic switch cyclically while at the same time making the second means operable and inoperable, also cyclically, to keep the current in a substantially direct state in the load and let the current flowing in the load pass through the second means only periodically.

According to a first embodiment, the method of the invention is characterized in that the second means comprise a first electronic switch, in that the third means comprise a second electronic switch parallel-connected to an assembly formed by the first electronic switch and the first means to detect the presence of an alternating current, and in that the method gives rise, cyclically, to the sequencing of the following stages of operation so long as the load is powered:

during the first stage, the first electronic switch is closed and the second electronic switch is open;

during the second stage, the first and second electronic switches are both closed;

during the third stage, the first electronic switch is open and the second electronic switch is closed;

the fourth stage is identical to the second stage.

According to a second embodiment, the method according to the invention is characterized in that the second and third means comprise four electronic switches, in that the first switch and the fourth switch are both series-connected with the load, in that the third switch and the second switch are both series-connected and form an assembly parallel-connected with the first and fourth switches, in that the common point of the first and fourth switches is connected to the common point of the third and second switches, and in that the first means to detect the presence of an alternating current monitor the current flowing between the two common points and in that the method gives rise, cyclically, to the sequencing of the following stages of operation so long as the load is powered:

during the first stage, the first and second electronic switches are conductive and the third and fourth electronic switches are non-conductive;

during the second stage, all four electronic switches are conductive;

during the third stage, the first and second electronic switches are non-conductive and the third and fourth electronic switches are conductive;

during the fourth stage, all four electronic switches are conductive.

The invention will be understood more clearly and other advantages shall appear from the following detailed description of several embodiments illustrated by the appended drawings, wherein.

Figure 2:
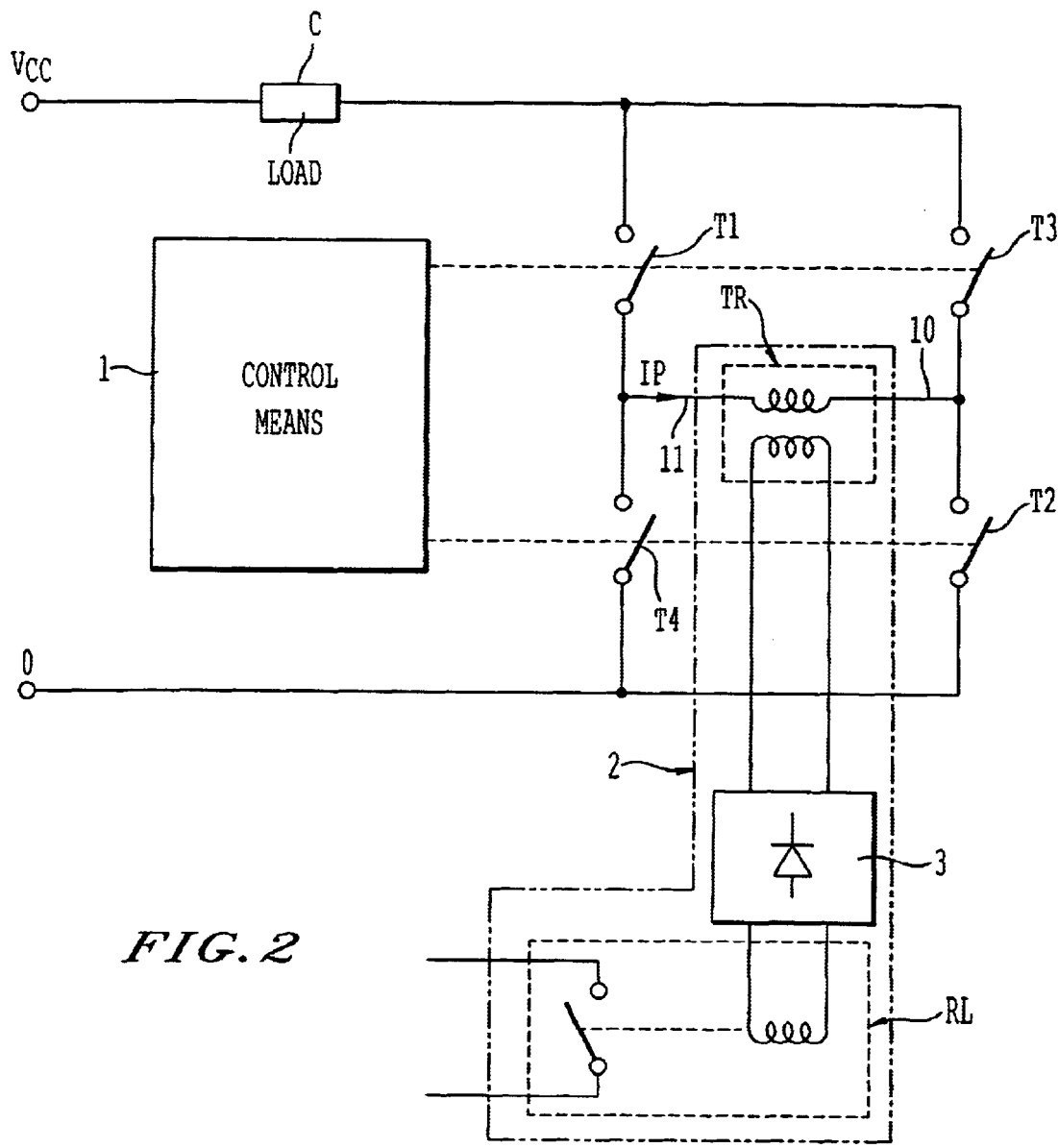
FIG. 2 shows a second embodiment in which four electronic switches series-connected with the load.
Figure 3:
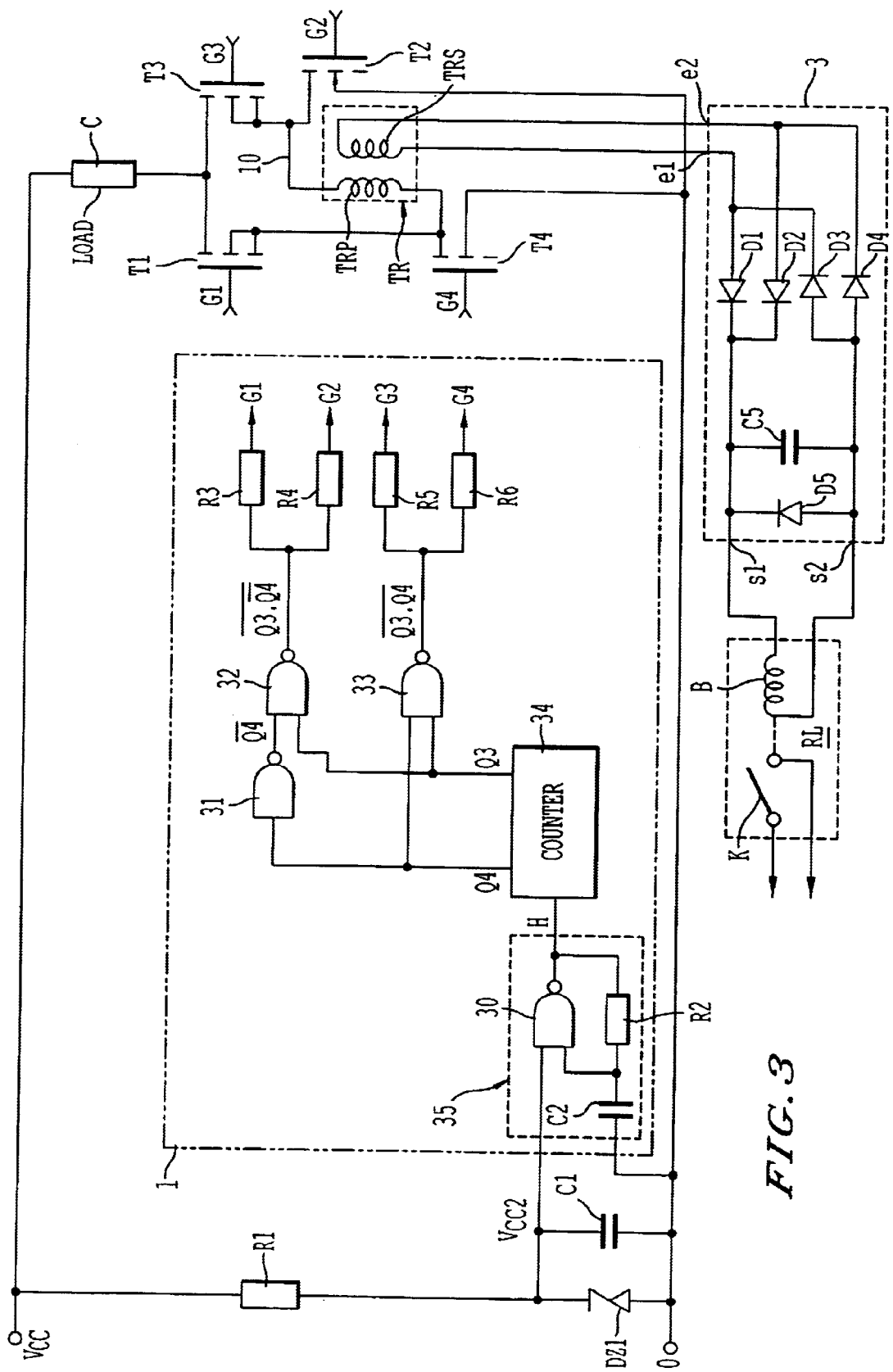

FIG. 3 gives a detailed view of the embodiment described in FIG. 2;

FIG. 4 gives a view in the form of a timing diagram of the working of the device shown in FIG. 3.

For greater convenience in the description, the same topological references represent the same elements in the different figures.

Figure 1:
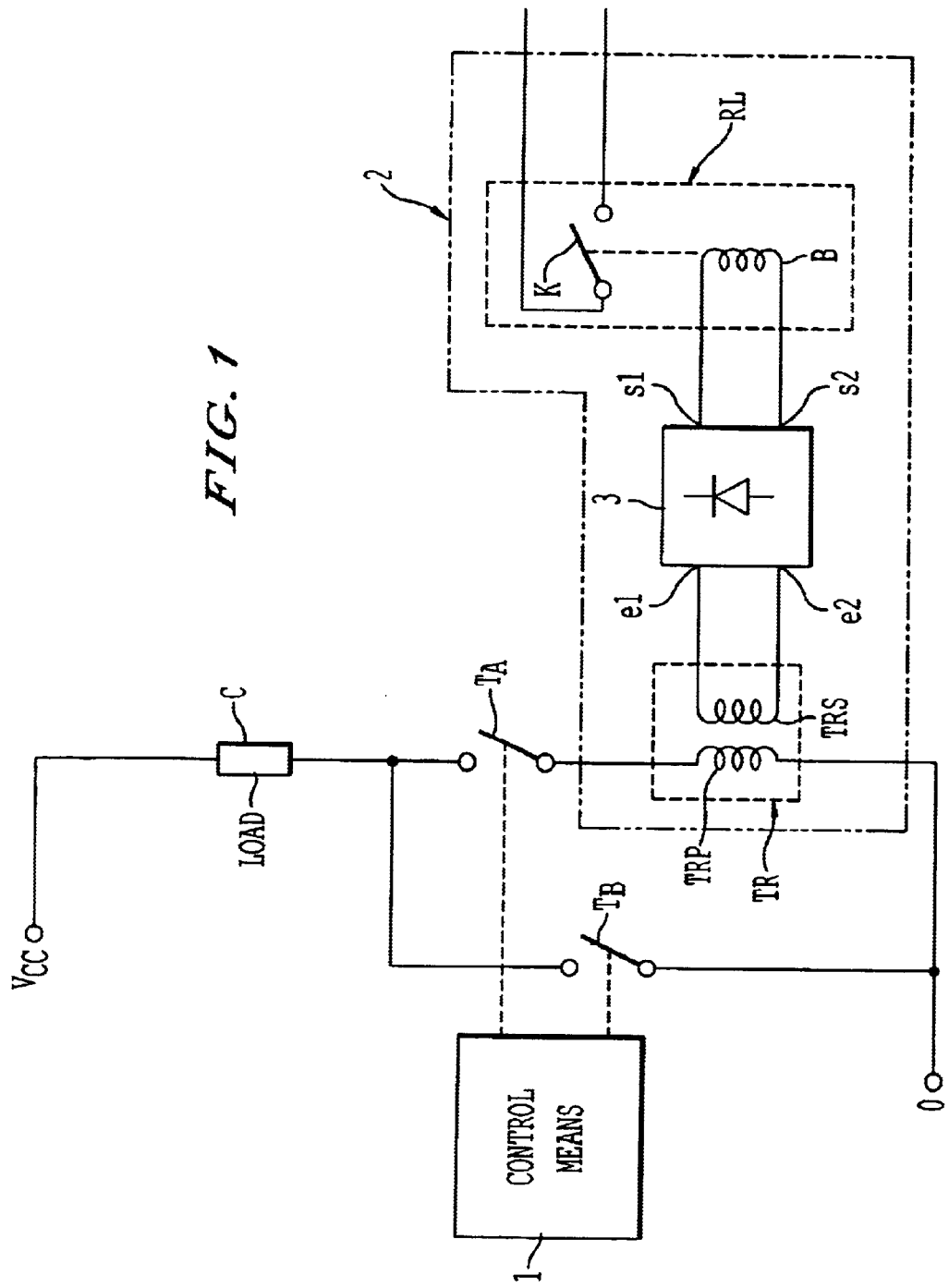
FIG. 1 shows a first embodiment in which two electronic switches are series-connected with the load.

In FIG. 1, a load C is powered by a DC voltage source. The DC voltage source has two terminals: 0 for the ground and VCC for the positive voltage point.

Between the two terminals 0 and VCC, series-connected with the load C, two electronic switches TA and TB have been placed in parallel. To open and close the electronic switches TA and TB, the device has control means 1 for the electronic switches TA and TB. The control means 1 can be made, for example, by adapting the principle that is described further below in greater detail by means of FIG. 3.

The device furthermore comprises means 2 to detect the presence of an alternating current flowing in the electronic switch TA. These means 2 comprise for example a current transformer TR. The current transformer TR has a primary winding TRP and a secondary winding TRS. The primary winding TRP of the current transformer TR is series-connected with the electronic switch TA and the terminal a of the DC voltage source. It is clear that the order in which the load C, the switch TA and the primary winding TRP are series-connected is immaterial for the implementation of the invention. The means used to detect the presence of the alternating current furthermore comprise a rectifier 3. The rectifier 3 has two input points e1 and e2 as well as two output points s1 and s2. When the rectifier 3 is powered, between its two input points e1 and e2, by an alternating current, there is then a substantially direct current flowing in the electronic component connected between the two output points s1 and s2. The secondary winding TRS of the current transformer TR is connected to the two input points e1 and e2 of the rectifier 3. The means 2 used to detect the presence of the alternating current furthermore comprise a relay RL. The relay RL has a coil B controlling the opening or closing of a contact K. The coil B is powered between the two output points s1 and s2 of the rectifier 3. The two connections of the contact K are connected to the exterior of the device.

When the electronic switch TA is open and closed alternately, an alternating current flows therein. This alternating current also flows in the primary winding TRP of the transformer of the current TR. This current induces another alternating current in the secondary winding TRS of the current transformer TR. This other alternating current is rectified by means of the rectifier 3. Between the output points s1 and s2 of the rectifier 3, there then flows a substantially direct current in the coil B. When a current of this kind flows in the coil B the contact K changes its state. The monostable relay RL is chosen for example so that it is normally open. Thus, when an alternating current flows in the primary winding TRP, the contact K is closed. By contrast, when no alternating current crosses the primary winding TRP, the contact K remains open. And it is possible to use the opening of this contact K to activate an alarm external to the device.

The device as described here above detects an anomaly in one of the components of the device. The relay K will not be accelerated for example in the following cases:
  absence of DC voltage between the terminals 0 and VCC of the DC voltage source;
  a cutting of the link between the terminals 0 and VCC and comprising the load C, the electronic switch TA and the primary winding TRP;
  a defect in the working of the control means 1 of the electronic switches TA and TB;
  a defect of operation of the rectifier 3;
  a cutting of one of the links connecting the secondary winding TRS, the rectifier 3 and the coil B of the relay RL.

It can be seen that no operating defect referred to here above can lead to the activation of the contact K. It is therefore not necessary to monitor the monitoring device itself.

The embodiment shown in FIG. 1 can be used to modulate the power dissipated in the load, for example by obtaining a variation in the cyclical ratio of the opening and closing of an electronic switch TA while at the same time leaving the electronic switch TB open. However, this embodiment may lead to electronic disturbances due to the frequent opening and closing of the electronic switch TA.

Advantageously, the embodiment shown in FIG. 1 works so that the current flowing in the load C remains substantially direct. For this purpose, it is possible to make four operating stages succeed one another:
  during the first stage ①, the electronic switch TA is closed and the electronic switch TB is open and a current flows in the primary winding TRP;
  during the second stage ②, the electronic switches TA and TB are both closed and no current flows in the primary winding TRP;
  during the third stage ③, the electronic switch TA is open and the electronic switch TB is closed and no current flows in the primary winding TRP;
  the fourth stage ④ is identical to the second stage ②.

Then, the four oscillating stages described here above are repeated so long as the load C is powered by the DC voltage source.

Thus, the current flowing in the primary winding TRP varies between a zero value and a value of the direct current flowing in the load C.

In the embodiment shown in FIG. 1, it is possible to do without the switch TA by adapting the relative impedance values of the primary winding TRP of the current transformer TR and the electronic switch TB so as to obtain a variation in the current flowing in the primary winding TRP between the time when the electronic switch TB is open and the time when the electronic switch TS is closed. This variant is economical. However, it prompts variations in current flowing in the load C, giving rise here again to electromagnetic disturbances.

FIG. 2 shows a mode of operation where the current flowing in the primary winding TRP may vary with an amplitude twice that of the current flowing in the primary winding TRP of the device described with reference to FIG. 1. This facilitates its detection.

As in FIG. 1, the device shown in FIG. 2 has a load C supplied with power between the two terminals VCC and 0 of a DC voltage source. By contrast, the device shown in FIG. 2 comprises four electronic switches T1, T2, T3 and T4. The first switch T1 and the fourth switch T4 are both series-connected between the load C and one of the terminals of the DC voltage source, for example the terminal 0. The third switch T3 and the second switch T2 are both series-connected and the assembly formed by the two switches T3 and T2 are parallel-connected with the assembly formed by the first and fourth switches T1 and T4. Furthermore, a link 10 connects the common point of the first and fourth switches T1 and T4 and the common point of the third and second switches T3 and T2. The means 2 used to detect the presence of an alternating current monitors the appearance of a current in the link 10. The means 2 is made in a manner similar to the one described by means of FIG. 1. The device shown in FIG. 2 also has control means 1 for the electronic switches T1 to T4. An exemplary embodiment of the control means 1 shall be described in greater detail further below by means of FIG. 3.

The device shown in FIG. 2 can work like the device shown in FIG. 1 in order that the current flowing in the load C may be substantially direct. Here too, four working stages are used.

- in a first stage ① the switches T1 and T2 are conductive and the switches T3 and T4 are non-conductive. A current IP flows in the link 10. Its direction is given by the arrow 11;
- in a second stage ② the four electronic switches T1, T2, T3 and T4 are all conductive and no current flows in the link 10;
- in a third stage ③ the electronic switches T1 and T2 are non-conductive and the electronic switches T3 and T4 are conducive. The current IP then flows in the link 10 in a direction opposite the arrow 11;
- the fourth stage ④ of operation is identical to the second stage of operation and no current flows in the link 10.

Then, the four operating stages described here above are repeated so long as the load C is powered by the DC voltage source.

The four-stage mode of operation described here above thus makes it possible never to interrupt the current flowing in the load C. By contrast, it is possible to make the device shown in FIG. 2 work so as to modulate the power dissipated by the load C in replacing the second stage ② and fourth stage ④ by stages where the four switches T1, T2, T3 and T4 are all non-conductive. However, the rest of the description shall deal solely with the four-stage operating mode which ensures that a substantially direct current flows constantly through the load C.

FIG. 3 gives a more detailed view of the device shown in FIG. 2. From the two terminals VCC and 0 of the DC voltage source, a secondary DC voltage source is set up between a VCC terminal 2 and the terminal 0. There is a resistor R1 and a Zener diode DZ1 series-connected between the terminal VCC and the terminal 0. The cathode of the Zener diode DZ1 is connected to the resistor R1. A capacitor C1 is parallel-connected to the Zener diode DZ1. These three components, the resistor R1, the Zener diode DZ1 and the capacitor C1, form the secondary DC voltage source at the common point between the resistor R1 and the Zener diode DZ1. This common point forms the VCC terminal 2. When the invention is applied in aeronautics, it is common practice to have a 28 volt DC voltage which will be, for the invention, the potential of the VCC terminal. The potential of the VCC terminal 2 will for example be equal to 12 volts. The potential of the VCC terminal 2 is used to power the control means 1 of the electronic switches T1 to T4.

The control means 1 have four $\overline{\text{AND}}$ logic gates 30 to 33 and a binary counter 34. The logic gates 30 to 33 and the counter 34 are powered by the potential of the VCC terminal 2. Their supplies are not shown in FIG. 3, The control means 1 comprise a clock 35 comprising a logic gate 30, a resistor R2 and a capacitor C2. The logic gate 30 is for example an $\overline{\text{AND}}$ logic gate with a controlled triggering threshold. This logic gate is known as a NAND SCHMITT GATE. A first input of the logic gate 30 is directly connected to the VCC terminal 2. A second input of the logic gate 30 is connected to the terminal 0 by means of the capacitor C2. The second input of the logic gate 30 is also connected to the output of the logic gate 30 by means of the resistor R2. At the output of the logic gate 30, there is a clock signal H connected to a terminal of the counter 34 adapted to receiving this signal H. The value of the frequency of the signal H depends on the value of the resistor R2 and the value of the capacitor C2. The counter 34 increments for example at each leading edge of the clock signal H. The counter 34 has for example four outputs Q1, Q2, Q3 and Q4 at which the result of the binary counting is available. The counting is done on four bits, each available at one of the outputs Q1 to 04. Q1 represents the least significant bit and Q4 the most significant bit.

In FIG. 3, only the two outputs Q3, Q4 having most significant bits are shown. For greater convenience, the reference mark of the output of the counter is identified with the signal available at this output.

A first input of the logic gate 33 receives the signal Q3 and a second input of the logic gate 33 receives the input Q4 so that a signal $\overline{Q3.Q4}$ is available at output of the logic gate 33. The two inputs of the logic gate 31 receive the signal Q4 so that a signal $\overline{Q4}$ is available at output of the output gate 31. The logic gate 32 receives the signal Q3 at one of its inputs and the signal $\overline{Q4}$ at the other of its inputs. At output of the logic gate 32, there is a signal $\overline{Q3.\overline{Q4}}$. The signal $\overline{Q3.\overline{Q4}}$ is propagated towards a control G1 of the electronic switch T1 by means of a resistor R3. This same signal also gets propagated towards a control G2 of the electronic switch T1 by means of a resistor R4. The signal $\overline{Q3.Q4}$ gets propagated towards a control G3 of the electronic switch T3 by means of a resistor R5. This same signal also gets propagated to a control G4 of the electronic switch T4 by means of a resistor R6. The electronic switches T1 to T4 are field-effect transistors. They are respectively controlled at their gates C1 to G4. The drains of the transistors T1 and T3 are both connected to the point of the load not connected to the terminal VCC. The source of the transistor T1 is connected to the drain of the transistor T4. The source of the transistor T4 is connected to the terminal 0. The source of the transistor T3 is connected to the drain of the transistor T2. The source of the transistor T2 is connected to the terminal 0. The link 10 is connected, firstly, between the source of the transistor T1 and the drain of the transistor T4 and, secondly, between the source of the transistor T3 and the drain of the transistor T2.

The invention is described with reference to field-effect transistors. It is clear that the invention could be implemented with any type of electronic switch for which it is possible to control both the opening and closing as for example in the case of bipolar transistors or insulated gate bipolar transistors (IGBT), The link 10 is made through the primary winding TRP of the current transformer TR. The secondary winding TRS of the current transformer TR is connected to the two inputs e1 and e2 of the rectifier 3.

The rectifier 3 has five diodes D1, D2, D3, D4 and D5 as well as a capacitor C5. The point e1 is connected to the anode of the diode D1 and to the cathode of the diode D3. The point e2 is connected to the anode of the diode D2 and to the cathode of the diode D4. The capacitor C5 and the diode D5 are connected between, firstly, the cathodes of the diodes D1 and D2 which are both connected together and, secondly, the anodes of the diodes D3 and 04 which are both connected together. The anode of the diode D5 is connected to the anodes of the diodes D3 and D4 to form the point s2. The point s1 for its part is located at the cathode of the diode D5. The relay RL is similar to the one described by means of FIG. 1. Its coil B is connected between the points s1 and s2. The capacitor C5 is used to smoothen the DC voltage obtained between the points s1 and s2. The diode D5 protects the capacitor C5 which, for example, may be a chemical capacitor when the direct current stops and the coil B gets demagnetized.

FIG. 4 shows nine timing diagrams 4a to 4i developing in the same time scale in order to give a clearer explanation of the working of the device in a four-state cycle where the direct current in the load flows permanently. The timing diagrams 4a to 4g represent the logic signals progressing between two logic levels 0 and 1.

The timing diagram 4a represents the clock signal H. The signal H is a rectangular signal with constant frequency.

The timing diagram 4b represents the signal Q1 available at a first output of the counter 34. The signal Q1 is a rectangular signal whose frequency is half the frequency of the signal H. The signal Q1 changes its logic state at the same time as each leading edge of the clock signal H.

The timing diagram 4c represents the signal Q2 available at a second output of the counter 34. The signal Q2 is a rectangular signal whose frequency is half the frequency of the signal Q1. The signal Q2 changes its logic state at the same time as each trailing edge of the signal Q1.

The timing diagram 4d represents the signal Q3 available at a third output of the counter 34. The signal Q3 is a rectangular signal whose frequency is half the frequency of the signal Q2. The signal Q3 changes its logic state at the same time as each trailing edge of the signal Q2.

The timing diagram 4e represents the signal Q4 available at a third output of the counter 34. The signal Q4 is a rectangular signal whose frequency is half the frequency of the signal Q3. The signal Q4 changes its logic state at the same time as each trailing edge of the signal Q3.

The timing diagram 4f represents the signal $\overline{Q3.Q4}$ available at the output of the logic gate 33. The signal $\overline{Q3.Q4}$ is equal to 1 on the entire timing diagram except when the signals Q3 and Q4 are simultaneously equal to 1. When this latter condition is fulfilled, the signal $\overline{Q3.Q4}$ is equal to 0.

The timing diagram 4g represents the signal $\overline{Q3.Q4}$ available at the output of the logic gate 32. The signal $\overline{Q3.Q4}$ is equal to 1 on the entire timing diagram except when, simultaneously, the signal Q3 is equal to 1 and the signal Q4 is equal to 0. When this latter condition is fulfilled, the signal $\overline{Q3.Q4}$ is equal to 0.

When the signal $\overline{Q3.Q4}$ is equal to 1, the electronic switches T1 and T2 are conductive. When the signal $\overline{Q3.Q4}$ is equal to 0, the electronic switches T1 and T2 are not conductive. Similarly, when the signal $\overline{Q3.Q4}$ is equal to 1, the electronic switches T3 and T4 are conductive. When the signal $\overline{Q3.Q4}$ is equal to 0, the electronic switches T3 and T4 are not conductive. The four stages ①, ②, ③ and ④ of operation of the device, described here above, are shown earlier in the timing diagram 4i.

The control means 1, shown in FIG. 3, ensure that the four stages ①, ②, ③ and ④ of operation have substantially the same duration. It is clear that the invention can be implemented whatever the relative duration of the different operating stages. This is also applicable for operating times described on the basis of the device shown in FIG. 1. It is noted that the second and fourth operating stages have the function of preventing the current from being interrupted in the load C.

The timing diagram 4h represents the value of the current IP flowing in the link 10. During the first stage ① of operation of the device, namely the stage when the electronic switches T1 and T2 are both conductive, the current IP is positive and constant. The current IP is equal to the current flowing in the load C. During the second stage ② of the device, namely the stage when the four electronic switches T1 to T4 are all conductive, the current IP is zero. During the third stage ③ of operation of the device, namely the stage when only the electronic switches T3 and T4 are conductive, the current IP is negative and constant. Its value is equal and opposite in sign to the value that the current IP had in the first stage ① of operation of the device. During the fourth stage ④ of operation of the device, namely the stage when the four electronic switches T1 to T4 are all conductive, the current IP is zero. At the end of the fourth stage ④ of operation, the four stages ①, ②, ③ and ④ of operation described here above are repeated so long as the load C is supplied with power by the DC voltage source. It may be recalled that the current IP also flows in the primary winding TRP of the current transformer TR.

The secondary winding TRS of the current transformer for its part is crossed by the current IS. The current IS is shown in the timing diagram 4i. The direction of the current IS is conventionally chosen so that the current IS is positive when the current IP rises. Consequently, at the beginning of the first stage ① of operation, the current IS grows rapidly and then decreases slowly until it gets cancelled before the end of the first stage ① of operation, At the beginning of the second stage ② of operation, the current IS decreases swiftly and the increases slowly until it gets cancelled. The current IS gets cancelled before the end of the second stage ② of operation. For the current IS, the third stage ③ of operation is identical to the second stage ② of operation. The fourth stage ④ of operation for its part is identical to the first stage ① of operation.

The components of the rectifier 3, especially the capacitor 5, are chosen in such a way that, so long as the four stages ①, ②, ③ and ④ described here above are sequenced, the substantially direct current may flow in the coil B of the relay RL and thus control the contact K.

What is claimed is:

1. Method for monitoring flow of a substantially direct current in a load, utilizing a device comprising, series-connected with the load, a current detector configured to detect a presence of an alternating current, a first switching mechanism configured to interrupt a current flowing in the current detector, and a second switching mechanism configured to short-circuit the current detector and first switching mechanism, and the method comprises performing cyclically, as long as the load is powered:

first controlling the current to flow only in the current detector and in the first switching mechanism;

second controlling the current to flow both in the first switching mechanism and in the second switching mechanism;

third controlling the current to flow only in the second switching mechanism; and fourth controlling the current to flow identically as in the second controlling.

2. Method according to claim 1, wherein the first switching mechanism includes a first electronic switch, the second switching mechanism includes a second electronic switch parallel-connected to an assembly formed by the first electronic switch and the current detector, during the first controlling, the first electronic switch is closed and the second electronic switch is open, during the second controlling, the first and second electronic switches are both closed, during the third controlling, the first electronic switch is open and the second electronic switch is closed, and the fourth controlling is identical to the second controlling.

3. Method according to claim 1, wherein the first and second switching mechanism include first to fourth electronic switches, the first electronic switch and the fourth electronic switch are both series-connected with the load, the third electronic switch and the second electronic switch are both series-connected and form an assembly parallel-connected with the first and fourth electronic switches, a common point of the first and fourth electronic switches is connected to a common point of the second and third electronic switches and the current detector to detect the presence of the alternating current and monitor the current flowing between the two common points, during the first controlling, the first electronic switch and second electronic switch are conductive and the third electronic switch and fourth electronic switch are non-conductive, during the second controlling, all four electronic switches are conductive, during the third controlling, the first electronic switch and second electronic switch are non-conductive and the third electronic switch and fourth electronic switch are conductive, and during the fourth controlling, all four electronic switches are conductive.

4. Method according to claim 3, wherein the current detector includes a current transformer having a primary winding crossed by the alternating current and a secondary winding that delivers a piece of information representing the flow of current in the load.

5. Method according to claim 4, wherein the piece of information is a second alternating current, the current detector further includes a rectifier, inputs of the rectifier are connected to the secondary winding, and the presence of a current flowing between the outputs of the rectifier controls an active position of a mono stable relay.

6. Method according to claim 5, wherein the first to fourth electronic switches include field effect transistors.

7. Method according to claim 4, wherein the first to fourth electronic switches include field effect transistors.

8. Method according to claim 3, wherein the first to fourth electronic switches include field effect transistors.

9. Method according to claim 1, wherein the current detector includes a current transformer having a primary winding crossed by the alternating current and a secondary winding that delivers a piece of information representing the flow of current in the load.

10. Method according to claim 9, wherein the piece of information is a second alternating current, the current detector further includes a rectifier, inputs of the rectifier are connected to the secondary winding, and the presence of a current flowing between the outputs of the rectifier controls an active position of a monostable relay.

11. Method according to claim 10, wherein the first and second switching mechanisms include field effect transistors.

12. Method according to claim 9, wherein the first and second switching mechanisms include field effect transistors.

13. Method according to claim 2, wherein the first and second electronic switches are field effect transistors.

14. Method according to claim 2, wherein the current detector includes a current transformer having a primary winding crossed by the alternating current and a secondary winding that delivers a piece of information representing the flow of current in the load.

15. Method according to claim 14, wherein the piece of information is a second alternating current, the current detector further includes a rectifier, inputs of the rectifier are connected to the secondary winding, and the presence of a current flowing between the outputs of the rectifier controls an active position of a monostable relay.

16. Method according to claim 15, wherein the first and second electronic switches include field effect transistors.

17. Method according to claim 14, wherein the first and second electronic switches include field effect transistors.

* * * * *